United States Patent
Katayama et al.

(10) Patent No.: US 7,457,424 B2
(45) Date of Patent: Nov. 25, 2008

(54) ELECTRONIC VOLUME DEVICE AND REMOTE CONTROLLER THEREOF

(75) Inventors: Mutsumi Katayama, Saitama (JP); Masashi Hino, Saitama (JP)

(73) Assignees: Honda Giken Kogyo Kabushiki Kaishi, Tokyo (JP); Honda Access Corp., Saitama (JP)

( * ) Notice: Subject to any disclaimer, the term of this patent is extended or adjusted under 35 U.S.C. 154(b) by 800 days.

(21) Appl. No.: 10/661,534

(22) Filed: Sep. 15, 2003

(65) Prior Publication Data

US 2004/0058654 A1  Mar. 25, 2004

(30) Foreign Application Priority Data

Sep. 20, 2002  (JP) ............................ P2002-275629
Sep. 20, 2002  (JP) ............................ P2002-275652

(51) Int. Cl.
- *H03G 3/00* (2006.01)
- *H03G 7/00* (2006.01)
- *H03G 9/00* (2006.01)
- *H04R 5/02* (2006.01)
- *H04B 7/00* (2006.01)
- *H04M 3/00* (2006.01)
- *H04Q 7/20* (2006.01)

(52) U.S. Cl. ................... 381/105; 381/104; 381/106; 381/102; 381/311; 455/41.2; 455/420; 455/430

(58) Field of Classification Search ......... 381/102–109, 381/311; 455/41.2, 420, 430
See application file for complete search history.

(56) References Cited

U.S. PATENT DOCUMENTS

| 4,363,001 | A | 12/1982 | Suzuki et al. | |
|---|---|---|---|---|
| 5,201,068 | A | 4/1993 | Kawashima | |
| 5,659,373 | A | 8/1997 | Hoekstra | |
| 5,883,963 | A * | 3/1999 | Tonella | 381/104 |
| 6,360,187 | B1 * | 3/2002 | Hermann | 702/191 |
| 6,396,549 | B1 | 5/2002 | Weber | |
| 6,980,092 | B2 * | 12/2005 | Turnbull et al. | 340/425.5 |
| 2002/0052182 | A1 * | 5/2002 | Mayuzumi | 455/41 |

FOREIGN PATENT DOCUMENTS

JP  5-308230  11/1993

OTHER PUBLICATIONS

European Search Report dated Jan. 18, 2005.

* cited by examiner

*Primary Examiner*—Vivian Chin
*Assistant Examiner*—Devona E. Faulk
(74) *Attorney, Agent, or Firm*—Westerman, Hattori, Daniels & Adrian, LLP.

(57) ABSTRACT

An electronic volume device of an invention includes a common volume I/O 371 for receiving an i-th common volume level Dcom[i] (i=1 to N) on a common scale of N steps, a volume converter 373 for converting the Dcom[i] into a j-th unique volume level Dvol[j] on a unique scale of n steps; and a volume controller 372 for controlling an electronic volume based on the unique volume. The volume converter 373 includes a volume memory for storing an offset between the Dcom[i] and the Dvol [j] and a volume controller that controls at least one of the Dvol[j] and the offset such that the received Dcom agrees with the sum of the Dvol[j] and the offset and controls the Dvol[j] on a higher priority than the offset.

4 Claims, 13 Drawing Sheets

ELECTRONIC VOLUME DEVICE AND REMOTE CONTROLLER THEREOF

BACKGROUND OF THE INVENTION

1. Field of the Invention

The present invention relates to an electronic volume device and a remote controller thereof, and in particular, to an electronic volume device remotely controlled based on a volume control signal defined by the Blue tooth standard specification and a remote controller thereof.

2. Description of the Related Art

A technology that remotely controls an electronic volume mounted in an audio player by operating a volume control key of a remote controller is disclosed in Japanese Patent Application Laid-Open No. 5-308230. The remote controller is provided with a "+(volume up)" key and a "–(volume down)" key as the volume control key and, in some cases, is further provided with a "mute" key for attenuating the volume to the lowest level at a stretch.

As the Blue tooth standard is defined a standard for remotely controlling the volume of a head set mounted on a head from an audio gateway, for example, a mobile phone, which is connected to the head set by radio. In this standard, 16 steps from "0" to "15" are prepared as a volume scale.

For example, in the volume control between a TV and its remote controller, an absolute volume is supplied to the TV by the remote controller, but a signal for relatively changing a present volume, for example, a signal of "volume up by one step" or a signal of "volume down by one step" is outputted to the TV from the remote controller. A player and a remote controller complying with the Blue tooth standard transmit an absolute volume of 16 steps between them to recognize a present volume and for example, when the present volume is "8", if the "+" key of the remote controller is pressed down, the remote controller gives a direction of volume "9" to the player. When the volume is changed from "9" to "10" in the audio player, the change information is transmitted also to the remote controller. Thus, if the "+" key is next pressed down in the remote controller side, the remote controller gives a direction of volume "11" to the audio player.

It is desired in consideration of operating the electronic volume with gloves on that the electronic volume of the head set mounted on a helmet be reduced in the number of steps of volume control, thereby being simplified. For example, it is desirable that the volume scale be narrowed to four steps, for example, "mute", "small volume for a halt", "middle volume for running at low and middle speeds", and "large volume for running at high speed". However, when the number of steps of volume control of the player is reduced, the following drawbacks could be produced.

Figure 24:
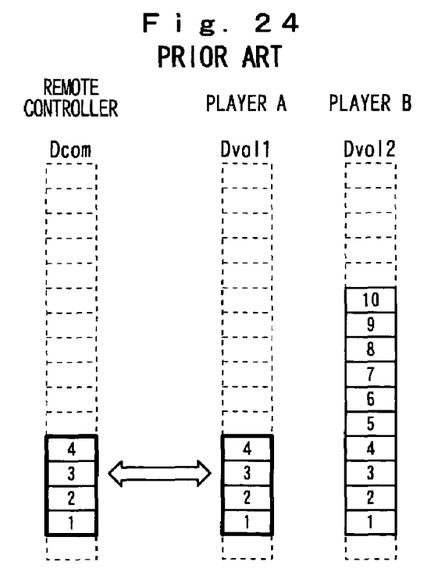
FIGS. 24 to 26 are illustrations for describing a problem in a prior art.

In FIG. 24, when the volume scale of a remote controller is reduced to 4 steps of from Dcom[1] to Dcom[4] in accordance with 4 steps of a player A, even if a player B having a volume scale of 10 steps is remotely controlled by this remote controller, the player B cannot output volume corresponding to Dvol2 [5] to Dvol2[10] and hence cannot sufficiently increase volume.

Figure 25:
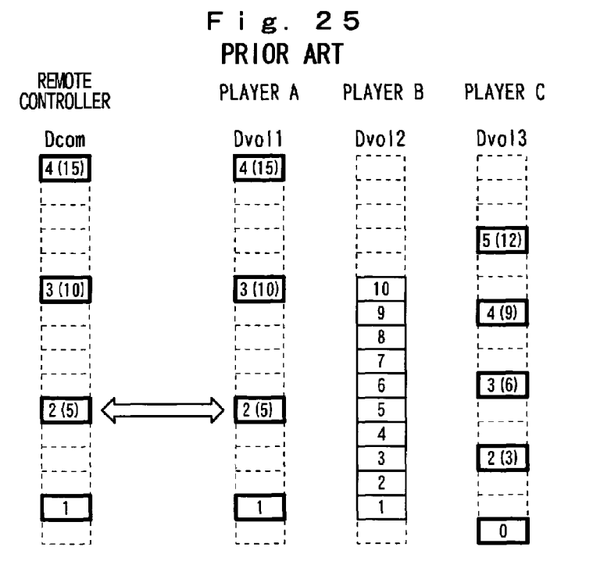

In a case where the volume level Dcom is discontinuously assigned to the remote controller, as shown in FIG. 25, in order to cope with such a technical problem, when the respective Dvol1s are assigned to the respective Dcoms in the same way like the player A, there is no problem, but when the Dvol2s are divided into 10 steps like the player B, some volumes cannot be set by the remote controller; then, when the respective Dvol3s do not agree with the respective Dcoms like a player C, it is impossible to remotely control the player C by the remote controller.

Figure 26:
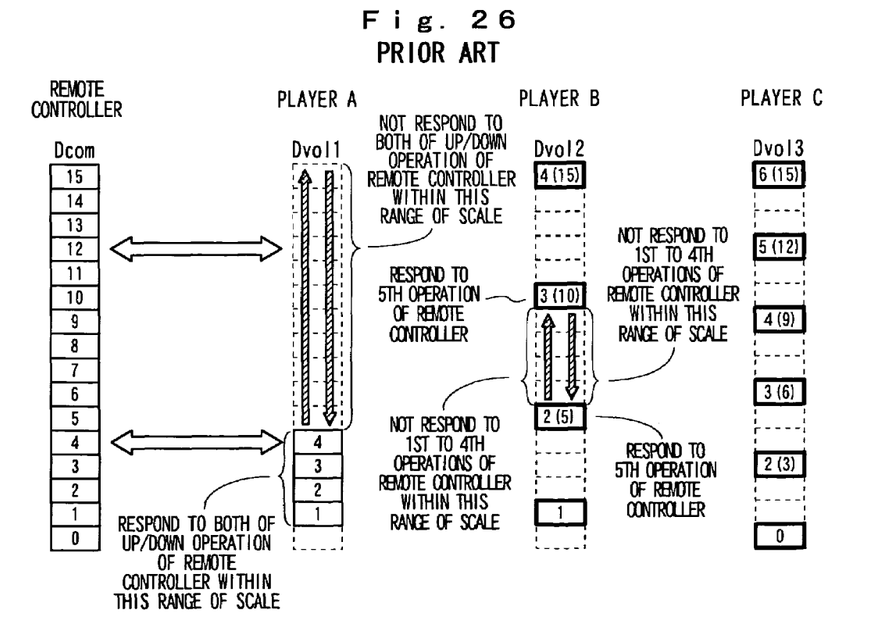

Further, as shown in FIG. 26, in a case where the remote controller has a volume scale of 16 steps, as long as the player A having the volume scale of 4 steps is given a direction of volume within a range of from Dcom[1] to Dcom[4] from the remote controller, the player A can control the electronic volume at the directed volume. However, when the "+" key is continuously pressed down beyond the Dcom [4] to increase the volume, for example, to Dcom [8], even if the "–" key is thereafter continuously pressed down so as to decrease the volume, the remote controller transmits Dcom[7], Dcom[6], and Dcom[5] to the player A but the player A can not decrease the volume in this range. That is, there is a problem that although the "–" key is continuously pressed down, the volume is not decreased.

In case where a player has a volume scale of 4 steps but the steps are discrete like the player B, there is a problem that even if the remote controller supplies the player with Dcom [5] and then the "+" key is further pressed down, the volume is not increased until the volume reaches Dcom[10]. Even if the number of steps of the volume scale is increased like the player C, such a problem will similarly occur.

As described above, there is presented a technical problem that when the volume scale of the player is decreased to a smaller number of steps than the 16 steps of the Blue tooth standard specification, ease of operation by the remote controller is impaired.

In this regard, such a technical problem can be solved by separately preparing a remote controller specifically designed for the number of steps of volume control of the player, but the general versatility of the remote controller is impaired to interfere with a combination of the remote controller and the other devices, which does not square with the concept of the Blue tooth that places emphasis on general versatility.

SUMMARY OF THE INVENTION

An object of the invention is to provide an electronic volume device capable of ensuring an excellent remote operability and a remote controller thereof.

In order to achieve the above-mentioned object, the invention is characterized in that the following means have been taken in the electronic volume device remotely controlled by a remote controller and the remote controller thereof.

(1) An electronic volume device of the invention includes: means for receiving an i-th common volume level $Dcom[i]$ (i=1 to N) on a common scale of N steps; means for converting the received $Dcom[i]$ into a j-th unique volume level $Dvol[j]$ on a unique scale of M steps (M<N); and means for controlling an attenuation factor based on the $Dvol[j]$. The converting means further includes: means for storing an offset value Doffset between the Dcom [i] and the $Dvol[j]$; and means for adjusting at least one of the $Dvol[j]$ and the Doffset such that the received $Dcom[i]$ agrees with the sum of the $Dvol[j]$ and the Doffset. The adjusting means is characterized by adjusting the $Dvol[j]$ on a higher priority than the Doffset.

According the above-mentioned feature, when the Dcom beyond the upper limit of Dvol is transmitted to the electronic volume device from the remote controller side, the electronic volume device increases only the Doffset with the Dvol held at the upper limit and then when the Dcom starts to decrease, decreases the Dvol on a higher priority than the Doffset, so that the electronic volume device can immediately decrease the volume.

Similarly, when the Dcom below the lower limit of Dvol is transmitted to the electronic volume device from the remote controller side, the electronic volume device decreases only the Doffset with the Dvol held at the lower limit and then when the Dcom starts to increase, increases the Dvol on a higher priority than the Doffset, so that the electronic volume device can immediately increase the volume.

(2) An electronic volume device of the invention includes: means for managing a correspondence relationship between an i-th common volume level Dcom[i] (i=1 to N) on a common scale of N steps and a j-th unique volume level Dvol1[j] (j=1 to M) on a unique scale of M steps; means for receiving the Dcom from the remote controller; means for storing the Dcom; an electronic volume whose attenuation factor is controlled based on the Dcom; a volume switch for directing Dvol1 on the unique scale; means for converting the directed Dvol1 into Dcom based on the correspondence relationship; and means for updating and registering the converted Dcom in the storing means.

According to the above-mentioned feature (2), the remote controller gives a direction of the attenuation factor of the electronic volume by means of the volume level Dcom on the common scale. While the direction of the attenuation factor of the electronic volume is given to the electronic volume device by means of the volume level Dvol1 on the unique scale, this Dvol1 is converted into Dcom and thus the attenuation factor of the electronic volume is controlled based on the Dcom. Thus, the electronic volume device can ensure the general versatility of the device itself and the remote controller and use the unique scale as for controlling the volume.

(3) A remote controller of the invention includes: means for managing a correspondence relationship between an i-th common volume level Dcom[i] (i=1 to N) on a common scale of N steps and a k-th unique volume level Dvol2[k] (k=1 to L) on a unique scale of L steps; means for storing a present Dcom; a volume switch for directing Dvol2 on the unique scale; means for converting the directed Dvol2 into Dcom based on the correspondence relationship; means for updating and registering the converted Dcom in the storing means; and means for transmitting the converted Dcom to the electronic volume device.

According to the above-mentioned feature (3), the remote controller can give a direction of the attenuation of the electronic volume by means of the volume level Dvol2 on the unique scale and this unique volume level Dvol1 is converted into the common volume level Dcom and then is transmitted to the electronic volume device. In the electronic volume device, the attenuation factor of the electronic volume is controlled based on the Dcom, so that the remote controller can ensure the general versatility of the device itself and the electronic volume device and use the unique scale as for controlling the volume.

DETAILED DESCRITPTION OF THE PREFERRED EMBODIEMNTS

Figure 1:
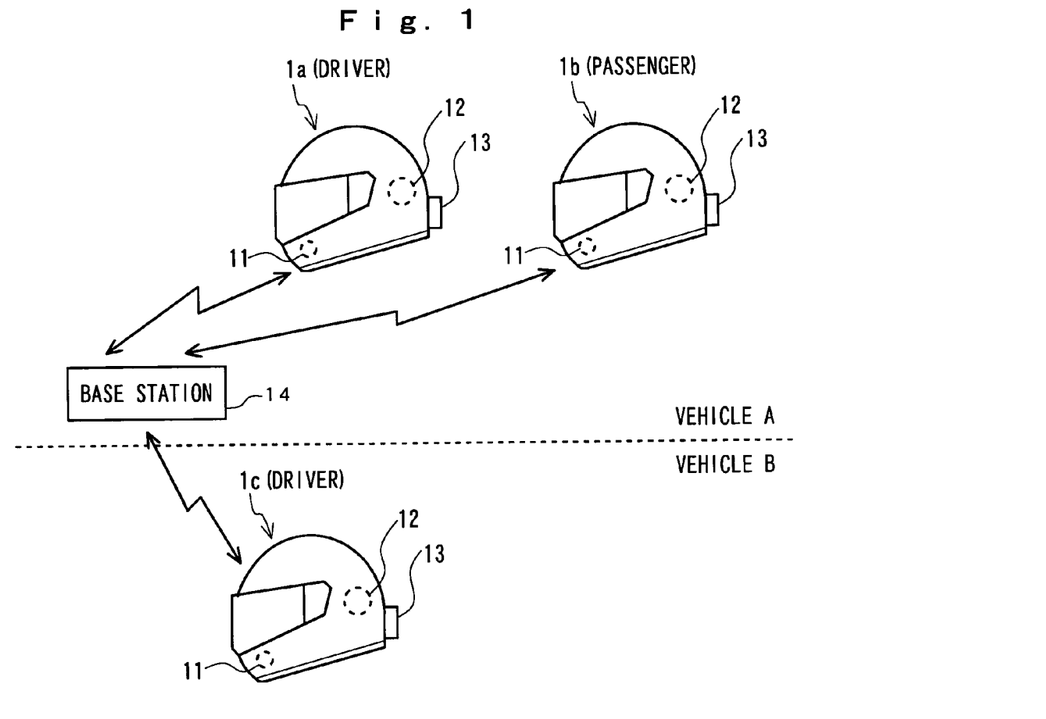
FIG. 1 is an illustration showing one example of a communications pattern by the use of an intercommunication system to which the invention is applied.

FIG. 1 is an illustration showing one example of a communications pattern by the use of an intercommunication system to which the invention is applied. A vehicle A is mounted with an on-vehicle radio terminal (base station) 14 having a function as a remote controller. Each of helmets 1a, 1b, and 1c worn by riders of the respective vehicles A and B is mounted with a head set including a microphone 11, a speaker 12 and a mobile radio terminal (radio unit) 13.

The above-mentioned on-vehicle radio terminal 14 and the respective mobile radio terminals 13 are pursuant to the Blue tooth standard. The on-vehicle radio terminal 14 operates in a master mode and the other mobile radio terminals 13 operates in a slave mode to perform radio communications over a pico-communications network.

Figure 2:
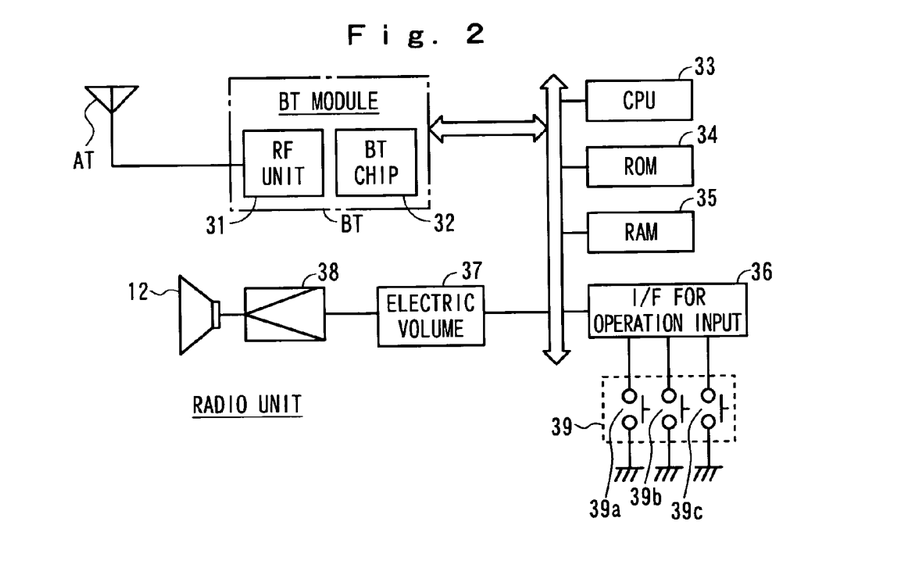
FIG. 2 is a block diagram showing the configuration of a communications system between an on-vehicle radio terminal and a radio terminal to which the invention is applied.

FIG. 2 is a block diagram showing the configuration of a main portion of the head set. In FIG. 2, constructions in description unnecessary for describing the invention will be omitted.

An antenna AT is connected to a blue tooth (BT) module. A CPU 33 performs various kinds of processings according to programs stored in a ROM 34. A RAM 35 supplies the CPU 33 with a work area. Various kinds of operation switches including a volume switch 39 and display units are connected to an I/O interface 36. The volume switch 39 includes at least a "+" key 39a, a "−" key 39b, and a "mute" key 39c. An electronic volume 37 attenuates an input signal by an attenuation factor responsive to the operation of the volume switch 39 and outputs it to an amplifier 38.

The BT module includes an RF unit 31 and a BT chip 32. The BT chip 32 performs a processing of establishing inter-pico-network synchronization between itself and a terminal on the other end of connection and a processing of coding/decoding a transmitting/receiving signal. That is, when the BT module transmits a carrier wave signal, the BT module digitally modulates the carrier wave signal by the transmitting data and spreads spectrum of the modulated carrier wave signal by frequency hopping. Then, the BT module amplifies the transmitting signal to a transmitting output level equal to or lower than a specified level and then transmits it to a radio terminal on the other end of communications from the antenna AT. Further, the BT module receives a radio signal transmitted from the radio terminal on the other end of communications via the antenna AT and reversely spreads spectrum of this and then digitally demodulates it.

Figure 3:
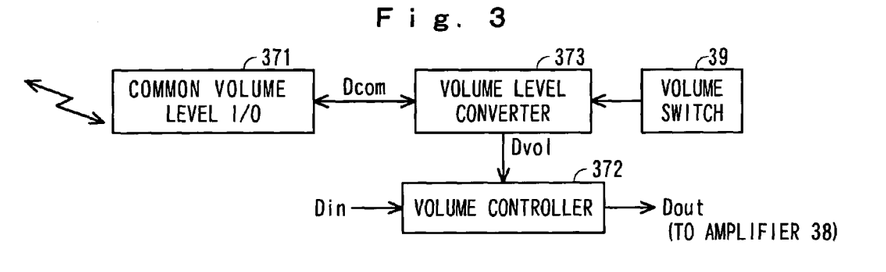
FIG. 3 is a block diagram showing the configuration of a main portion of an electronic volume device that is one embodiment of the invention.

FIG. 3 is a functional block diagram of the electronic volume device 37 that is a first embodiment of the invention. A common volume (Dcom) input/output 371 has a common volume level Dcom inputted from the on-vehicle radio terminal 14 and outputs a Dcom updated by the electronic volume 37 to the on-vehicle radio terminal 14. The above-mentioned Dcom is a volume defined on a volume scale of 16 steps of the Blue tooth standard specification and could be any one of 16 steps from Dcom[0] to Dcom[15].

A volume converter 373 converts the Dcom transmitted from the on-vehicle radio terminal 14 to a unique volume level Dvol. The above-mentioned Dvol is a volume defined on a volume scale of M steps unique to the head set and could be any one of m steps from Dvol [1] to Dvol [m]. Since the head set uses a volume scale of 4 steps in the present embodiment, the volume could be any one of 4 steps from Dvol[1] to Dvol[4]. A volume controller 372 attenuates the input signal Din by an attenuation factor responsive to the above-mentioned Dvol to generate an output signal Dout and supplies the output signal to the following amplifier 38.

Next, the operation of the present embodiment will be described with reference to the flow charts in FIGS. 4, 5, and 6. In this regard, the respective flow charts show mainly the operations of the volume converter 373.

Figure 4:
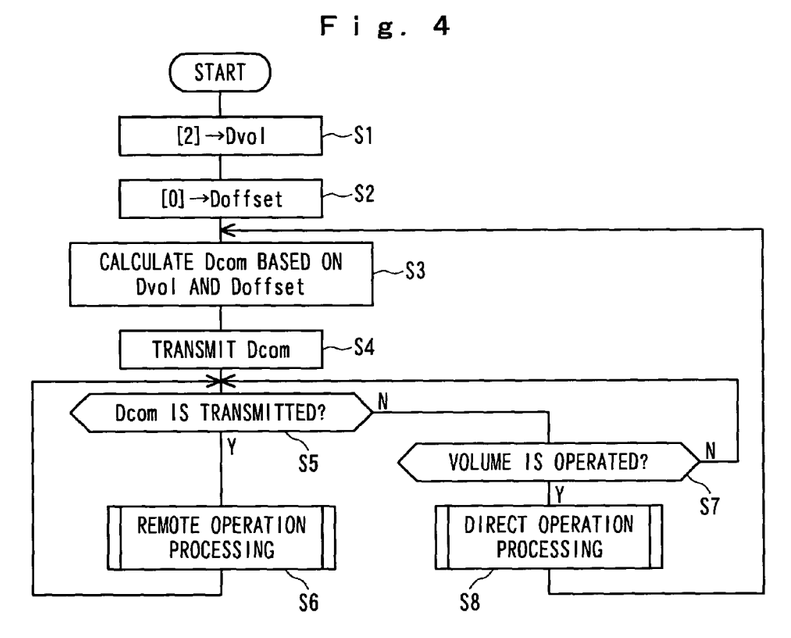
FIG. 4 is a flow chart of a volume control operation in an electronic volume device.
Figure 7:
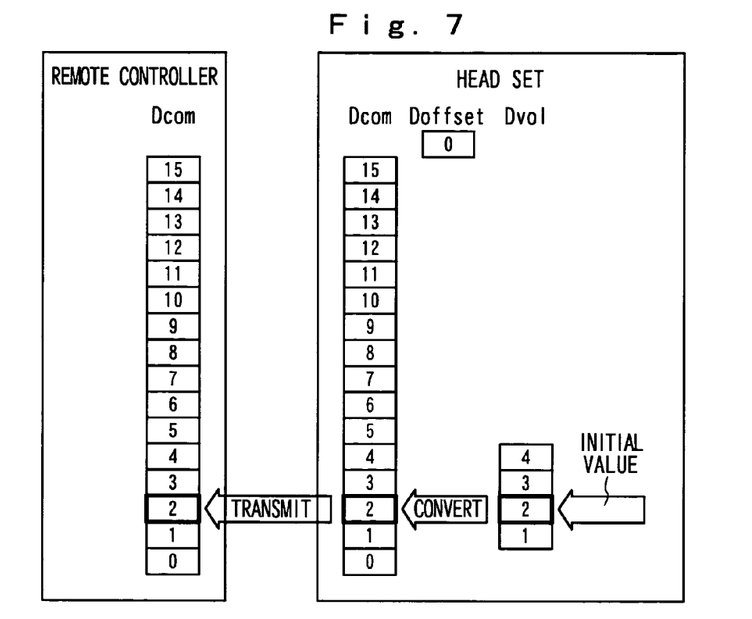
FIGS. 7 to 14 are illustrations that schematically show a volume control operation in the electronic volume device.

In steps S1 and S2 in FIG. 4, as shown in FIG. 7, an initial value "2" is registered in Dvol of the mobile radio terminal 13 and an initial value "0" is registered in an offset volume value Doffset. The Doffset means a difference between Dvol and Dcom. In step S3, Dcom is found as a sum of the above-mentioned Dvol and Doffset (=Dvol+Doffset). In step S4, Dcom is transmitted to the on-vehicle radio terminal 14. Since the Doffset is "0" in an initial state, Dvol[2] is here transmitted as Dcom to the on-vehicle radio terminal 14.

Figure 8:
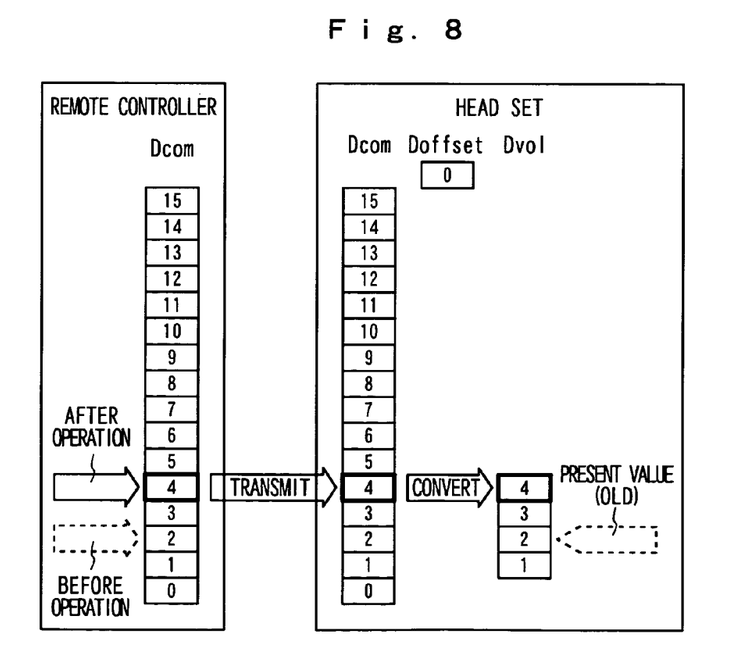

In step S5, it is determined whether or not Dcom is transmitted from the on-vehicle radio terminal 14. When the "+" key is pressed down two times in the vehicle-radio terminal 14, as shown in FIG. 8, Dcom[4] is transmitted from the on-vehicle radio terminal 14 to the head set. When the head set detects the transmission of Dcom[4] in step S5, the processing proceeds to step S6 where "a remote operation processing" of controlling the volume of the head set based on the transmitted Dcom [4] is performed.

Figure 5:
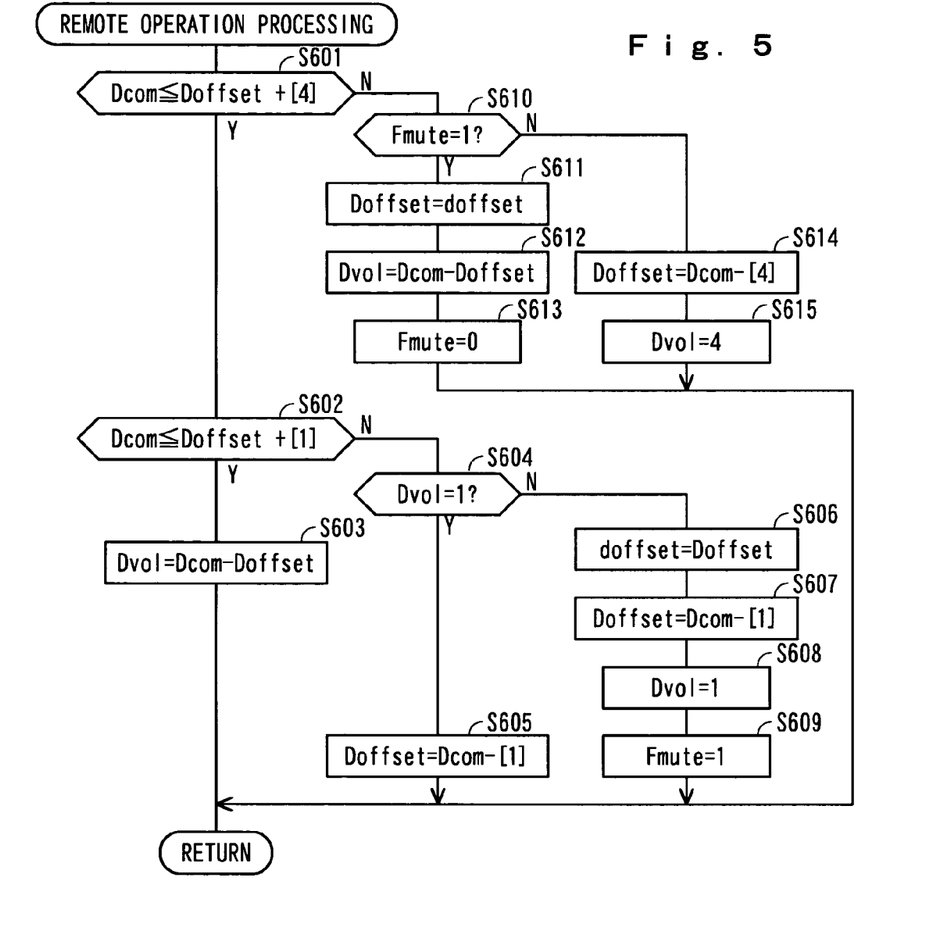
FIG. 5 is a flow chart of "a remote operation processing" in FIG. 4.

FIG. 5 is a flow chart showing the operation of the above-mentioned "remote operation processing". In step S601, the Dcom[4] given by the on-vehicle radio terminal 14 is compared with the sum of Doffset[0] and the number of steps [4] of the unique volume scale. Here, since Dcom[4] is smaller than (Doffset+4), the processing proceeds to step S602. In step S602, Dcom is compared with the sum of Doffset and [1]. Here, since Dcom is larger than (Doffset+1), the processing proceeds to step S603.

In step S603, as shown in FIG. 8, a value [4] obtained by subtracting Doffset [0] from Dcom[4] is updated and registered as Dvol. The volume controller 372 attenuates a reproduced signal Din by an attenuation factor responsive to the updated Dvol.

Figure 9:
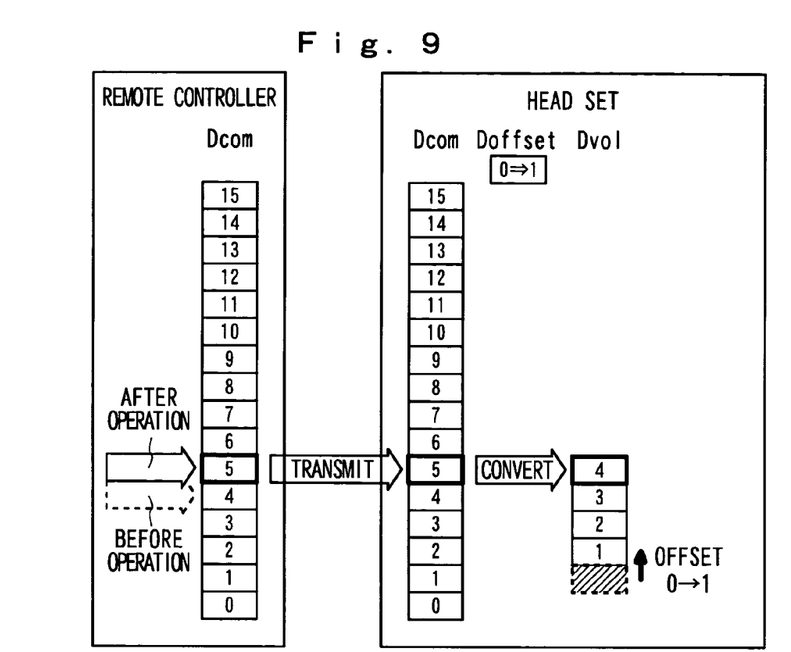

Thereafter, when the "+" key is further pressed down in the on-vehicle radio terminal 14, as shown in FIG. 9, Dcom[5] is transmitted from the on-vehicle radio terminal 14 to the head set. When this transmission of Dcom[5] is detected in the above step S5, it is determined in step S601 in FIG. 5 that Dcom[5] is larger than (Doffset+4), so that the processing proceeds to step S610. A mute flag Fmute is referred to in step S610. Here, the mute flag Fmute is in a reset state (Fmute=0), the processing proceeds to step S614. In step S614, as shown in FIG. 9, Doffset is updated to a value [1] obtained by subtracting the number of steps [4] of the unique volume scale from the transmitted Dcom[5]. In step S615, as shown in FIG. 9, the maximum value [4] is registered as Dvol.

As described above, in the present embodiment, when the new Dcom is transmitted from the on-vehicle radio terminal 14, at least one of Dvol and Doffset is increased such that this Dcom agrees with the sum of Dvol and Doffset. However, Dvol is increased on a higher priority than Doffset (step S603) and only in a case where even if Dvol is increased to the maximum value [4], Dcom does not agree with the sum of Dvol and Doffset (that is, in a case where the result of determination in step S601 is NO), Doffset is increased (step S614).

Figure 10:
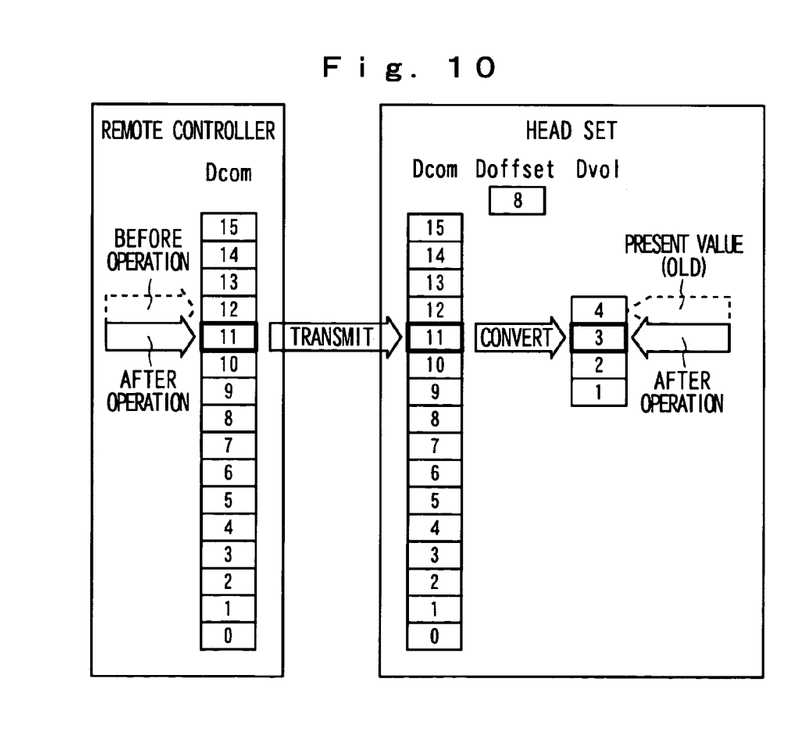

Next, as shown in FIG. 10, the operation in a case where the "−" key is pressed down in the on-vehicle radio terminal 14 from a state where Dcom is [12], Doffset is [8] and Dvol is [4] thereby to transmit Dcom[11] will be described.

Since it is determined in step S601 in FIG. 5 that the transmitted Dcom[11] is smaller than the sum of Doffset[8] and the number of steps [4] of the unique volume scale, the processing proceeds to step S602. Since it is determined in step S602 that the transmitted Dcom[11] is larger than the sum of Doffset[8] and [1], the processing proceeds to step S603. In step S603, as shown in FIG. 10, a value obtained by subtracting Doffset[8] from Dcom[11] is updated and registered as Dvol[3].

Figure 11:
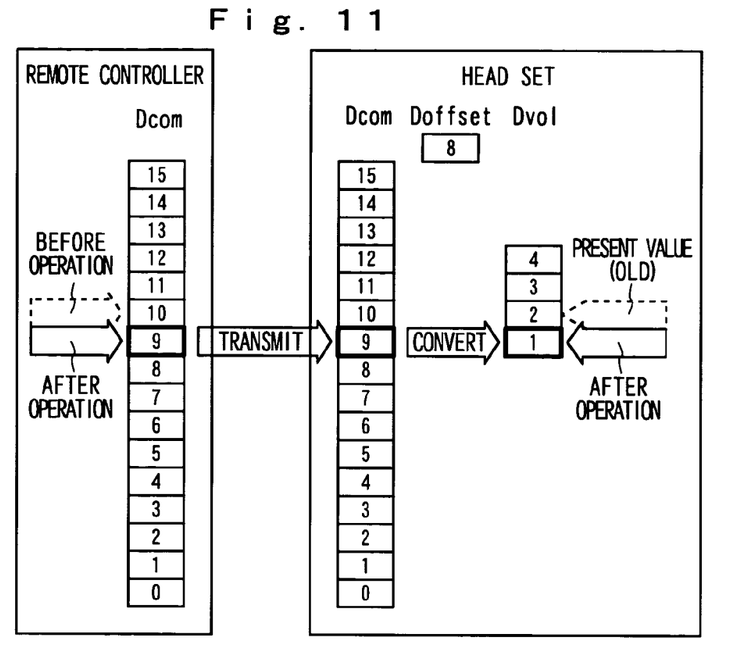

Thereafter, even if the "−" volume key is further pressed down in the on-vehicle radio terminal 14, the above-mentioned processing from steps S601 to step S603 is repeatedly performed until Dcom reaches [9], as shown in FIG. 11, so that Dvol is stepwise decreased to [1]. Since the volume of the head set depends on Dvol, every time the "−" volume key is pressed down in the on-vehicle radio terminal 14, the volume is decreased to this level.

Figure 12:
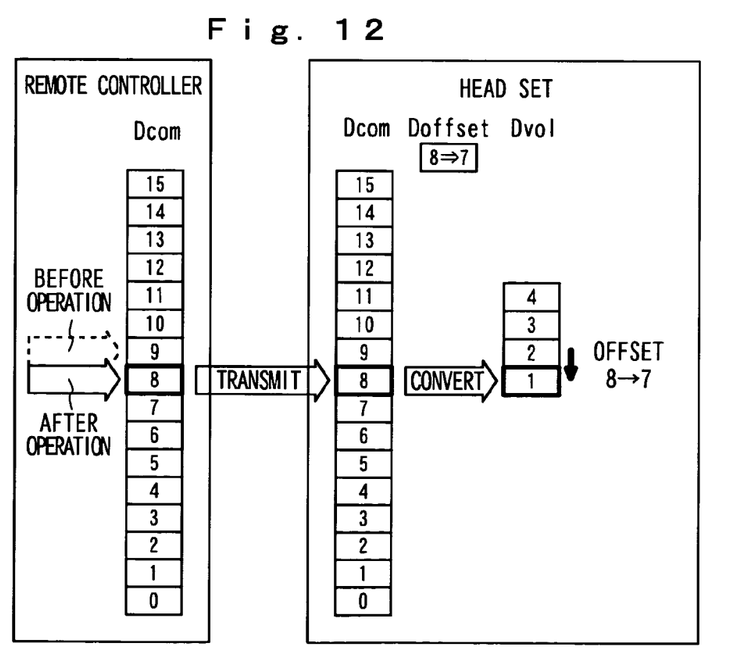

Thereafter, when the "−" volume key is further pressed down in the on-vehicle radio terminal 14 to transmit [8] as Dcom, as shown in FIG. 12, the result of determination in the above step S602 becomes No and hence the processing proceeds to step S604. It is determined in step S604 whether or not Dvol is [1] and here it is determined that Dvol is [1], so that the processing proceeds to step S605. In step S605, as shown in FIG. 12, Doffset is updated to a value [7] obtained by subtracting [1] from Dcom[8].

As described above, in the present embodiment, when Dcom smaller than the present value is transmitted from the on-vehicle radio terminal 14, at least one of Dvol and Doffset is decreased such that Dcom agrees with the sum of Dvol and Doffset. However, Dvol is decreased on a higher priority than Doffset (step S603) and only in a case where even if Dvol is decreased to the minimum value [1], Dcom does not agree with the sum of Dvol and Doffset (that is, in a case where the result of determination in step S602 is NO), Doffset is decreased (step S605).

Figure 13:
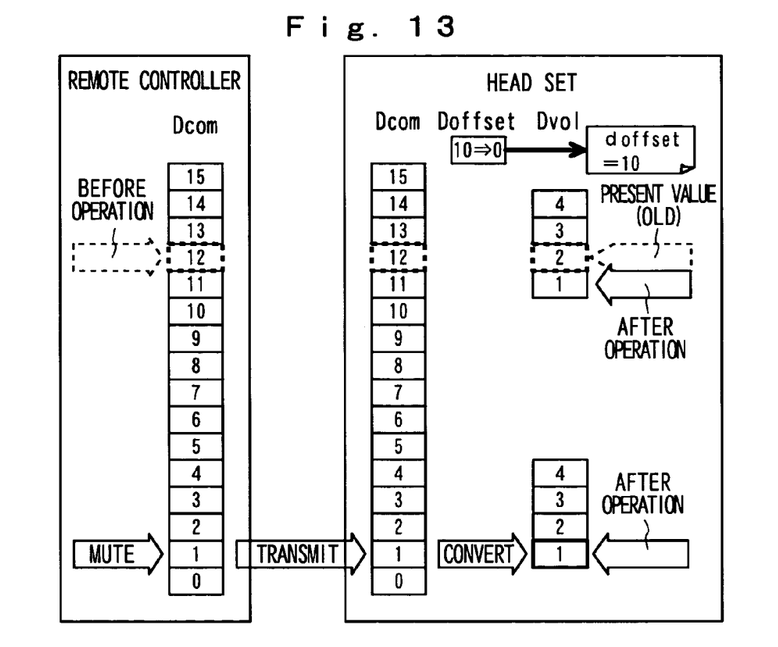

Next, as shown in FIG. 13, the operation in a case where the "mute" key is pressed down in the on-vehicle radio terminal 14 from a state where Dcom is [12], Doffset is [10] and Dvol is [2] thereby to transmit Dcom[1] will be described.

When Dcom[1] is transmitted, the result of determination in step S601 in FIG. 5 is YES and the result of determination in step S602 is NO, so that the processing proceeds to step S604. It is determined at the step S604 that Dvol is not [1], so that the processing proceeds to step S606. In step S606, the present Doffset [10] is temporarily saved as an immediately before proceeding offset value Doffset. In step S607, Doffset is updated to a value [0] obtained by subtracting [1] from Dcom[1]. In step 608, [1] is set at Dvol and the mute flag Fmute is set in step S609.

Figure 14:
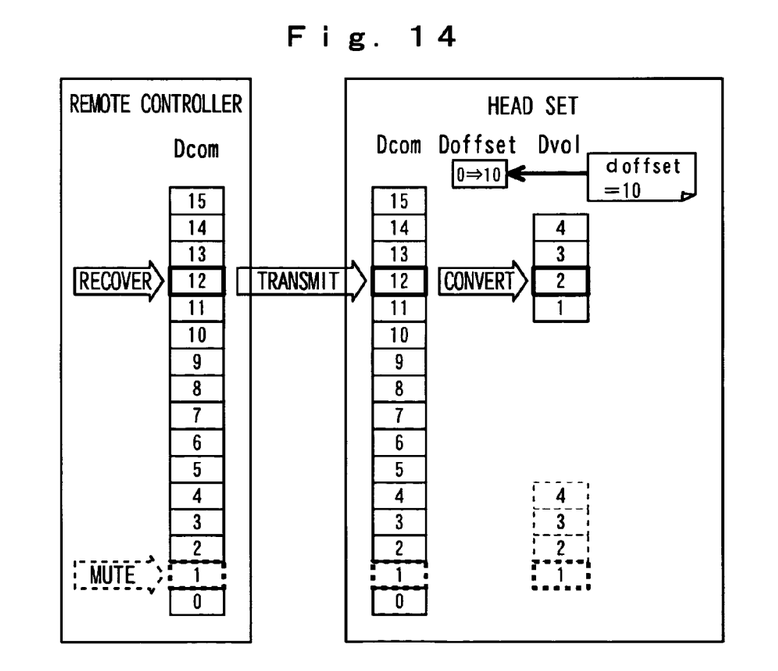

Next, when any key is pressed down, as shown in FIG. 14, [12] is transmitted as Dcom immediately before mute from the on-vehicle radio terminal 14. It is determined in step S601 that Dcom[12] is larger than the sum of Doffset[0] and [4], so that the processing proceeds to step S610. The mute flag Fmute is referred to in step S610. Then, it is determined that the Fmute is set, so that the processing proceeds to step S611. In step S611, as shown in FIG. 14, Doffset is returned to a Doffset value [10]. In step S612, Dvol is updated to a value [2] obtained by subtracting Doffset [10] from the transmitted Dcom[12]. The mute flag Fmute is reset in step S613.

Returning to FIG. 4, when the operation of the volume switch 39 mounted on the headset is detected in step S7, "a direct operation processing" in step S8 is performed.

Figure 6:
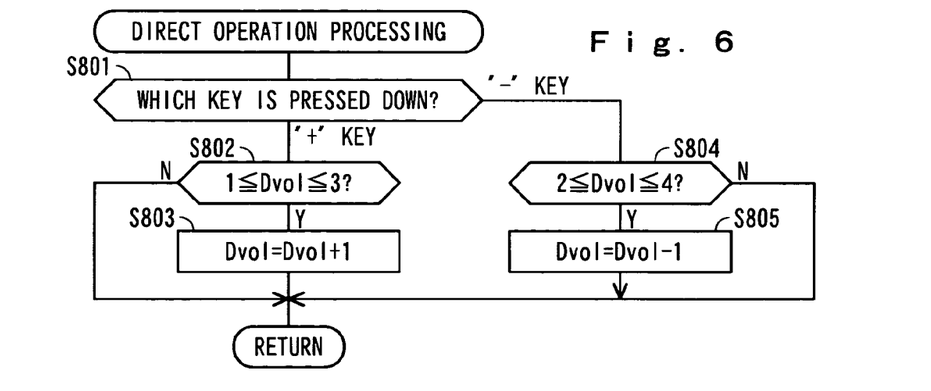
FIG. 6 is a flow chart of "a direct operation processing" in FIG. 4.

FIG. 6 is a flow chart showing the operation of the above-mentioned "direct operation processing" and it is determined in step S801 which key is pressed down. When the "+" key is operated, it is determined in step S802 whether or not the present Dvol is any one of [1], [2], and [3]. If the present Dvol is any one of [1], [2], and [3], Dvol is increased by [1] in step S803. If Dvol is [4], the processing is finished without any processing performed.

On the other hand, if it is determined in the above step S801 that the "–" key is operated, it is determined in step S804 whether or not the present Dvol is any one of [2], [3], and [4]. If the present Dvol is any one of [2], [3], and [4], Dvol is decreased by [1] in step S805. If Dvol is [1], the processing is finished without any processing performed.

Returning to FIG. 4, in step S3, Dcom is found as the sum of Dvol and Doffset (=Dvol+Doffset). In step S4, Dcom is transmitted to the on-vehicle radio terminal 14.

Figure 15:
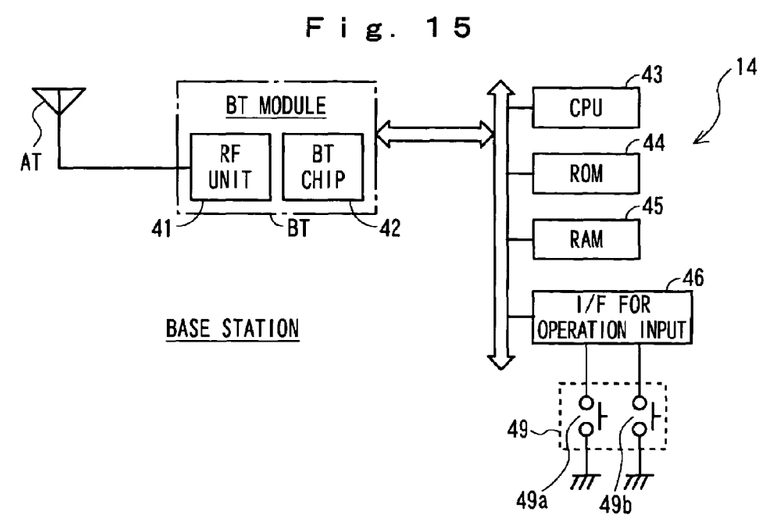
FIG. 15 is a block diagram showing the configuration of a communications system of an on-vehicle radio terminal to which the invention is applied.

FIG. 15 is a block diagram of the on-vehicle radio terminal 14 that is a second embodiment of the invention. In comparison of the vehicle-mounted radio terminal 14 with the mobile radio terminal 13 shown in FIG. 2, the speaker 12, the electronic volume 37 and the amplifier 38 are omitted in FIG. 15.

Figure 16:
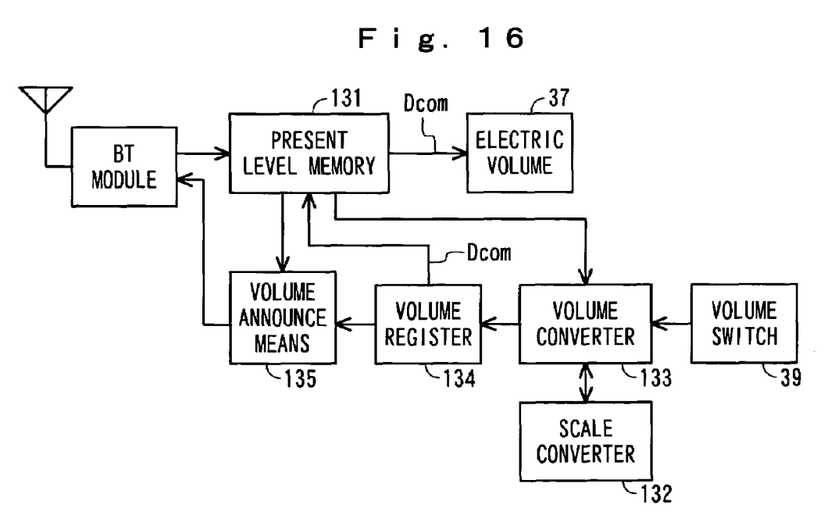
FIG. 16 is a functional block diagram of a mobile radio terminal to which the invention is applied.
Figure 17:
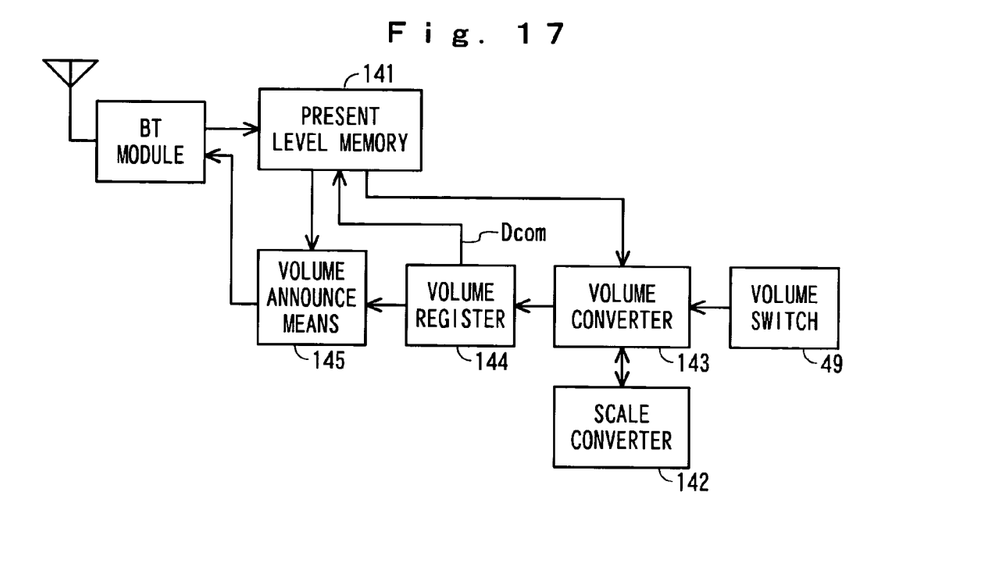
FIG. 17 is a functional block diagram of an on-vehicle radio terminal to which the invention is applied.

FIG. 16 is a functional block diagram of the mobile radio terminal 13 and FIG. 17 is a functional block diagram of the on-vehicle radio terminal 14.

In FIG. 16, a scale converter 132 is one function of the above-mentioned ROM 34. A correspondence relationship between the common volume level Dcom and the unique volume level Dvol is previously stored in the scale converter 132. Dvol1 is a volume which is defined on a volume scale unique to the mobile radio terminal 13 and could be any one of M steps of from Dvol1[1] to Dvol1[m]. In the present embodiment, the mobile radio terminal 13 uses a unique scale of 4 steps, so that Dvol1 could be any one from Dvol1[1] to Dvol1[4].

A present volume memory 131 is one function of the above-mentioned RAM 35. In the present volume memory 131 is stored Dcom transmitted by radio communication from the on-vehicle radio terminal 14 or Dcom set by volume operation of its own terminal 13. The attenuation factor of the electronic volume 37 is controlled based on the above Dcom.

A volume converter 133 is one function of the above-mentioned CPU 33 and increases or decreases Dcom stored in the present volume memory 131 in response to the volume operation of the volume switch 39 on the basis of the correspondence relationship registered in the scale converter 132. A volume register 134 updates and registers the increased or decreased Dcom in the present volume memory 131. A volume level announcer 135 transmits the increased or decreased Dcom to the on-vehicle radio terminal 14.

In FIG. 17, a scale converter 142 is one function of the above-mentioned ROM 44 and stores the correspondence relationship between the common volume level Dcom and the unique volume level Dvol2. Dvol2 is a volume defined on a volume scale of L steps unique to the on-vehicle radio terminal 14 and could be any one of 7 steps of from Dvol2[1] to Dvol2[7] in the present embodiment.

A present volume memory 141 is one function of the above-mentioned RAM 45. In the present volume memory 141 is stored Dcom transmitted from the mobile radio terminal 13 or Dcom set by the volume operation of its own terminal 14.

A volume converter 143 is one function of the CPU 43 and increases or decreases Dcom stored in the present volume memory 141 in response to the volume operation of the volume switch 49 on the basis of the correspondence relationship stored in the scale converter 142. A volume register 144 updates and registers the increased or decreased Dcom in the present volume memory 141. A volume level announcer 145 transmits the increased or decreased Dcom to the mobile radio terminal 13.

Figure 18:
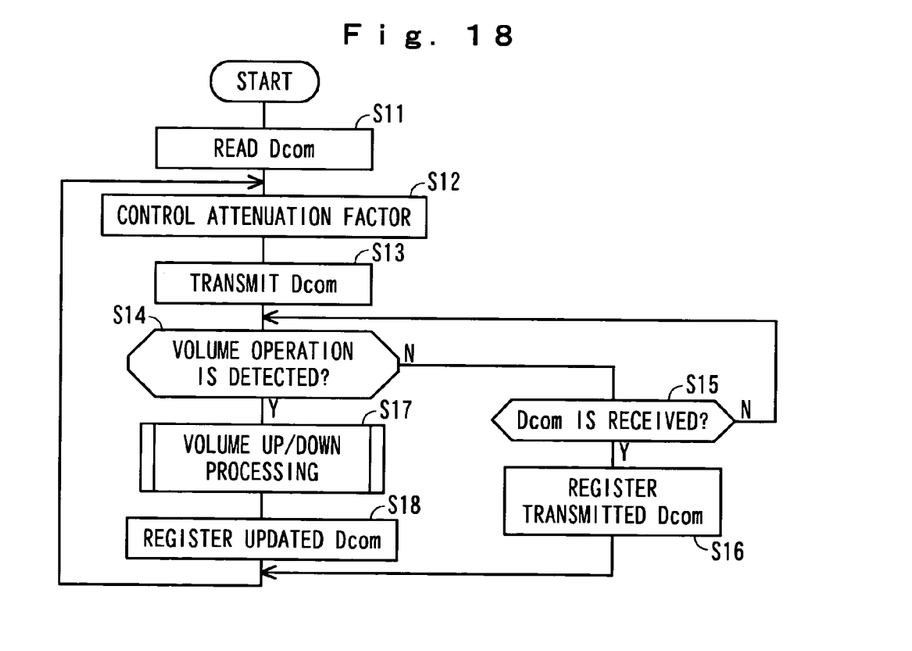
FIG. 18 is a flow chart showing a volume control procedure of a mobile radio terminal.

Next, the operation of the present embodiment will be described in detail with simultaneous reference to the flow charts in FIGS. 18 and 19. FIG. 18 shows the operation of the mobile radio terminal 13 and FIG. 19 shows the operation of the on-vehicle radio terminal 14.

In FIG. 18, in the mobile radio terminal 13, in step S11, the present Dcom is read out of the present volume memory 131 and is transmitted to the electronic volume 37. In step S12, the attenuation factor of the electronic volume 37 is controlled based on the read Dcom. Thus, the volume outputted from the speaker 12 of the head set is controlled based on the Dcom. In step S13, the read Dcom is transmitted as an initial value from the volume level announcer 135 to the on-vehicle radio terminal 14.

Figure 19:
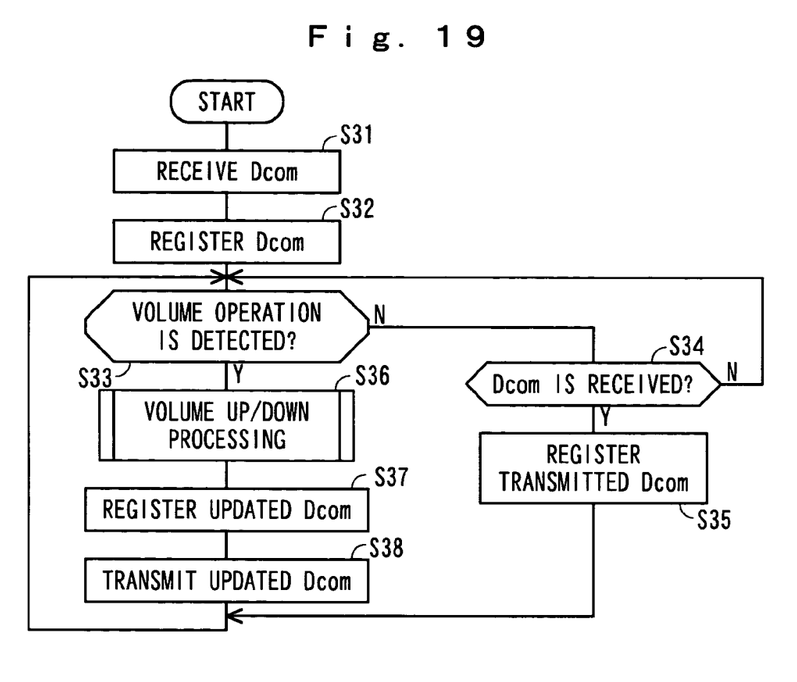
FIG. 19 is a flow chart showing a volume control procedure of an on-vehicle radio terminal.

In FIG. 19, when the on-vehicle radio terminal 14 receives Dcom from the mobile radio terminal 13 in step S31, it newly registers this Dcom in the present volume memory 141 in step S32. It is determined in step S33 whether or not the volume switch 49 of its own terminal 14 is operated and if the volume operation is not detected, the processing proceeds to step S34. It is determined in step S34 whether or not Dcom transmitted from the mobile radio terminal 13 is received and if the Dcom is not received, the processing returns to step S33.

Returning to FIG. 18, also in the mobile radio terminal 13, the initial value of Dcom is transmitted in step S13 and then it is determined in step S14 whether or not the volume switch 39 of its own terminal 13 is operated. If the operation of the volume switch 39 is detected, in step S17, "a volume up/down processing" is performed in which the volume converter 133 increases or decreases the Dcom registered in the present volume memory 131 in response to the above-mentioned volume operation with reference to the scale converter 132.

Figure 20:
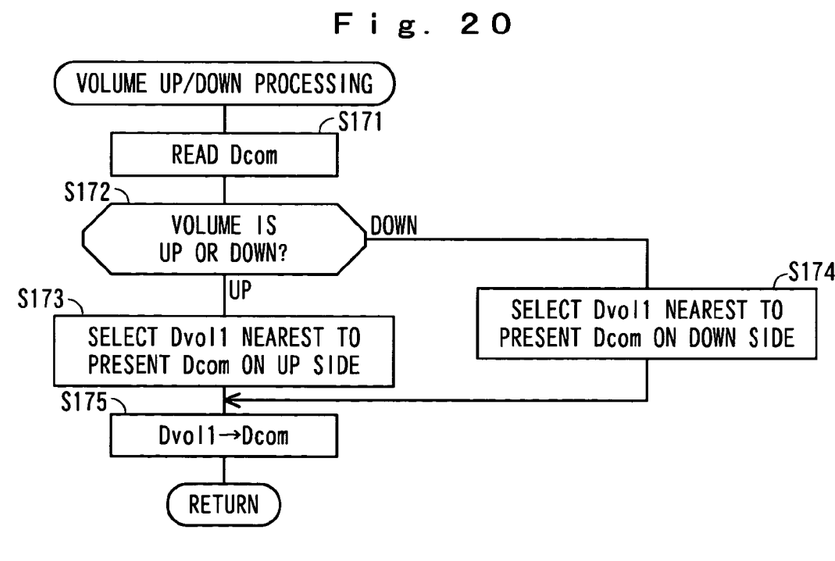
FIGS. 20 to 23 are illustrations that schematically show a volume control method of the invention.

FIG. 20 is a flow chart showing the operation of the above-mentioned "volume up/down processing". Here, as described in detail with reference to FIGS. 21, 22, and 23, taking cases where the volume switch 39 is increased (FIG. 21) and decreased (FIG. 22) from a state where the present Dcom is [9] as examples, the operation of the "volume up/down processing" will be described.

Figure 21:
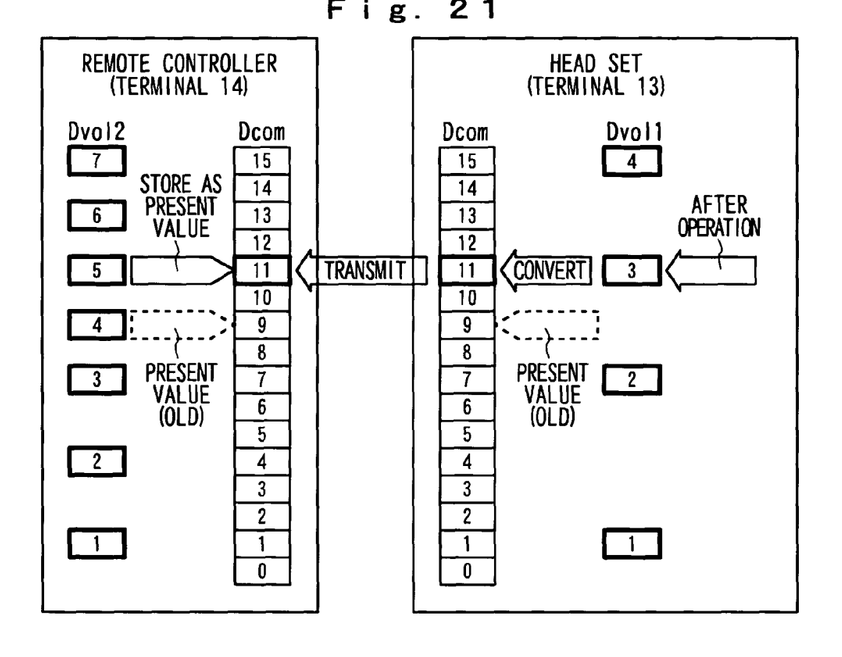
Figure 22:
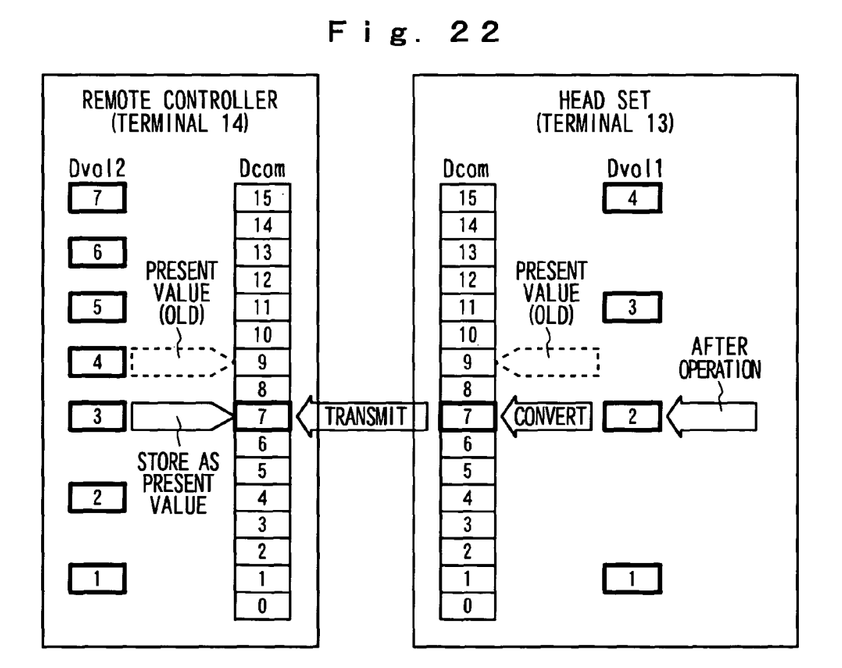
Figure 23:
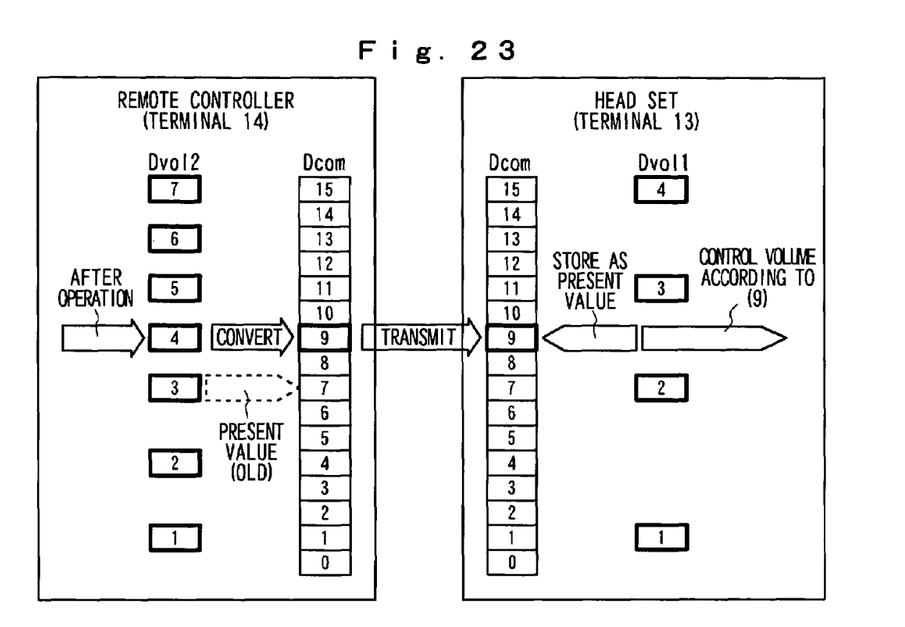

As shown in FIGS. 21, 22, and 23, in the present embodiment, four unique volumes from Dvol1[1] to Dvol1[4] of the mobile radio terminal 13 are defined as "very small volume suitable for halt", "small volume suitable for running at low speeds", "middle volume suitable for running at middle speeds" and "large volume suitable for running at high speeds", which correspond to Dcoms[1], [7], [11] and [15], respectively. In the same way, 7 unique volumes from Dvol2 [1] to Dvol2[7] of the on-vehicle radio terminal 14 correspond to Dcoms[1], [4], [7], [9], [11], [13], and [15], respectively.

In FIG. 20, in step S171, the present Dcom[9] is read out of the volume memory 131. It is determined in step S172 whether the volume operation is a volume up operation or a volume down operation.

If the volume operation is the volume up operation, in step S173, as shown in FIG. 21, one Dvol1 whose corresponding common volume level Dcom is nearest to the present Dcom [9] on a up side among Dcoms [1], [7], [11], and [15] is selected from four Dvol1s from Dvol1[1] to Dvol1[4]. In the present embodiment, the common volume level Dcom[11] corresponding to Dvol1[3] is nearest to Dcom[9] on the up side, so Dvol1[3] is selected. In step S175, the selected Dvol1 [3] is converted into Dcom[11].

On the other hand, if the volume operation is the volume down operation, in step S174, as shown in FIG. 22, Dvol1[2] whose corresponding common volume level Dcom is nearest to the present Dcom[9] on a down side among Dcoms[1], [7], [11], and [15] is selected from four Dvol1s from Dvol1[1] to Dvol1[4] in the same way. In step S175, the selected Dvol1[2] is converted into Dcom[7].

Returning to FIG. 18, when the increased or decreased Dcom is found in the above manner, in step S18, the increased or decreased Dcom is updated and registered in the present volume memory 131. Thereafter, the processing returns to step S12 where the attenuation factor of the electronic volume 37 is controlled based on the increased or decreased Dcom. In step S13, the increased or decreased Dcom is transmitted from the volume level announcer 135 to the on-vehicle radio terminal 14.

When the on-vehicle radio terminal 14 receives the increased or decreased Dcom in step S34 in FIG. 19, in step S35, this Dcom is updated and registered in the present volume memory 141 by the volume register 144.

On the other hand, when the volume switch 49 of the on-vehicle radio terminal 14 is operated and the operation of the volume switch 49 is detected in step S33 in FIG. 19, in step S36, the same "volume up/down processing" as the mobile radio terminal 13 is performed in the volume converter 143.

FIG. 23 is an illustration schematically showing the operation of the "volume up/down processing" in the on-vehicle radio terminal 14. Here, taking a case where the volume switch 39 is increased from a state where Dcom is [7] as an example, the operation of the "volume up/down processing" will be described.

In the present embodiment, one Dvol2 whose corresponding common volume level Dcom is nearest to the present Dcom[7] on an increasing side is selected from 7Dvol2s from Dvol2[1] to Dvol2[7]. In the present embodiment, the common volume level Dcom[9] corresponds to Dvol2[4] and is nearest to Dcom[7] on the increasing side, so that Dvol2[4] is selected. Then, the Dcom[9] corresponding to Dvol2[4] is found as the Dcom after volume up/down operation.

In step S37, the increased or decreased Dcom is updated and registered in the present volume memory 141 by the volume register 144. In step S38, the increased or decreased Dcom is transmitted from the volume level announcer 145 to the mobile radio terminal 13.

When the mobile radio terminal 13 receives this Dcom in step S15 in FIG. 18, in step S16, this Dcom is updated and registered in the present volume memory 131 by the volume register 134. Thereafter, the processing returns to step S12 where the attenuation factor of the electronic volume 37 is controlled based on the updated Dcom.

According to the first embodiment of the invention, the following effects will be achieved.

(1) Even if the volume scale of the remote controller (on-vehicle radio terminal 14) does not agree with the volume scale of the player (head rest), the volume control performed in the remote controller side can be correctly reflected in the player side.

(2) Even if the remote controller keeps on transmitting volume beyond the maximum volume of the player, if the remote controller outputs a notification of decreasing volume, the player can immediately decrease the volume.

(3) Even if the remote controller keeps on transmitting volume below the minimum volume of the player, if the remote controller outputs a notification of increasing volume, the player can immediately increase the volume.

According to the second embodiment of the invention, the following effects will be achieved.

(4) The remote controller (on-vehicle radio terminal 14) gives a direction of the attenuation factor of the electronic volume in the head set by means of the volume level Dcom on the common scale. In the head set, a direction of the attenuation factor of the electronic volume is given by means of the volume level Dvol1 on the unique scale, the Dvol1 is converted into Dcom, and the attenuation factor of the electronic volume is controlled based on Dcom. Thus, the electronic volume device can use the unique scale as for controlling the volume while ensuring the general versatility of its own device and the remote controller.

(5) The remote controller (on-vehicle radio terminal 14) gives a direction of the attenuation factor of the electronic volume in the head set by means of the volume level Dvol2 on the unique scale. The Dvol2 is converted into Dcom and then is transmitted to the electronic volume device (mobile radio terminal 13). In the electronic volume device, the attenuation factor of the electronic volume is controlled based on Dcom, so that the remote controller can use the unique volume scale as for controlling the volume while ensuring the general versatility of its own device and the electronic volume device.

What is claimed is:

1. An electronic volume device remotely controlled by a remote controller, the electronic volume device comprising:
   means for receiving an i-th common volume level Dcom[i] (i =1 to N) on a common scale of N steps;
   means for converting received Dcom[i] into a j-th unique volume level Dvol[j] on a unique scale of M steps (M<N); and
   means for controlling an attenuation factor based on the Dvol[j], wherein the converting means includes:
   means for storing an offset value Doffset between the Dcom[i] and the Dvol[j]; and
   means for adjusting at least one of the Dvol[j] and the Doffset such that the received Dcom[i] agrees with a sum of the Dvol[j] and the Doffset, wherein the adjusting means adjusts the Dvol[j] on a higher priority than the Doffset, wherein when the common volume level Dcom [i] is transmitted in a mute state, the saved offset value Doffset is recovered and the unique volume level Dvol[j] is set at a value obtained by subtracting the Doffset from the transmitted Dcom [i].

2. The electronic volume device as claimed in claim 1, further comprising means for previously transmitting a sum of the unique volume level Dvol[j] and the offset value Doffset to the remote controller.

3. The electronic volume device as claimed in claim 1, wherein when the common volume level Dcom[i] transmitted from the remote controller is a predetermined mute level, a present offset value Doffset is saved and the common volume level Dcom[j] is decreased to a predetermined level.

4. The electronic volume device as claimed in any one of claims 1 to 3, wherein the electronic volume device conducts radio communications with the remote controller according to a communication procedure complying with a Blue tooth standard.

* * * * *